United States Patent
Müller

(10) Patent No.: US 7,778,304 B2
(45) Date of Patent: Aug. 17, 2010

(54) MEASURING ARRANGEMENT AND MEASURING SYSTEM

(75) Inventor: Martin Müller, Regenstauf (DE)

(73) Assignee: Osram Opto Semiconductors GmbH, Regensburg (DE)

(*) Notice: Subject to any disclaimer, the term of this patent is extended or adjusted under 35 U.S.C. 154(b) by 234 days.

(21) Appl. No.: 12/011,427

(22) Filed: Jan. 25, 2008

(65) Prior Publication Data

US 2008/0197289 A1      Aug. 21, 2008

(30) Foreign Application Priority Data

Jan. 25, 2007 (DE) ........................ 10 2007 003 806
Mar. 12, 2007 (DE) ........................ 10 2007 011 804

(51) Int. Cl.
*H01S 3/14* (2006.01)
*H01S 5/00* (2006.01)

(52) U.S. Cl. .................. 372/68; 372/50.124; 372/50.21

(58) Field of Classification Search ............ 372/50.124, 372/50.21, 68
See application file for complete search history.

(56) References Cited

U.S. PATENT DOCUMENTS

| 6,434,179 | B1 | 8/2002 | Ebeling | |
| 6,860,350 | B2* | 3/2005 | Beuhler et al. | 180/167 |
| 2002/0131461 | A1 | 9/2002 | Strzelecki | |
| 2003/0053506 | A1 | 3/2003 | Coldren | |
| 2005/0207461 | A1* | 9/2005 | Philippens et al. | 372/43.01 |
| 2006/0285566 | A1* | 12/2006 | Ueki | 372/45.01 |
| 2007/0145388 | A1* | 6/2007 | Philippens et al. | 257/86 |

FOREIGN PATENT DOCUMENTS

| DE | 103 19 977 | 8/2004 |
| DE | 103 54 714 | 6/2005 |
| EP | 1 051 783 | 11/2000 |
| EP | 1 605 561 | 12/2005 |
| WO | WO 01/63708 | 8/2001 |
| WO | WO 2004/059698 | 7/2004 |
| WO | WO 2004/068166 | 8/2004 |
| WO | WO 2006/044758 | 4/2006 |

OTHER PUBLICATIONS

Search Report dated May 8, 2008 issued for the corresponding European Patent Application No. 07024806.7-2222.

* cited by examiner

*Primary Examiner*—Armando Rodriguez
(74) *Attorney, Agent, or Firm*—Cohen Pontani Lieberman & Pavane LLP

(57) ABSTRACT

A measuring arrangement comprises a radiation device (SE), having at least one first surface emitting semiconductor component (1) with a vertical emission direction, a detection device (DE) for detecting reflected radiation, and an evaluation circuit (AS), set up for controlling the radiation device (SE) and the detection device (DE) and for processing a detection result of the detection device (DE). The semiconductor component (1) comprises a semiconductor body (2) with a plurality of active regions (4a, 4b) suitable for generating radiation and arranged at a distance from one another in a vertical direction. In this case, a tunnel junction (5) is monolithically integrated in the semiconductor body (2) between two active regions (4a, 4b) and the two active regions (4a, 4b) are electrically conductively connected by means of the tunnel junction during operation of the semiconductor component (1).

38 Claims, 5 Drawing Sheets

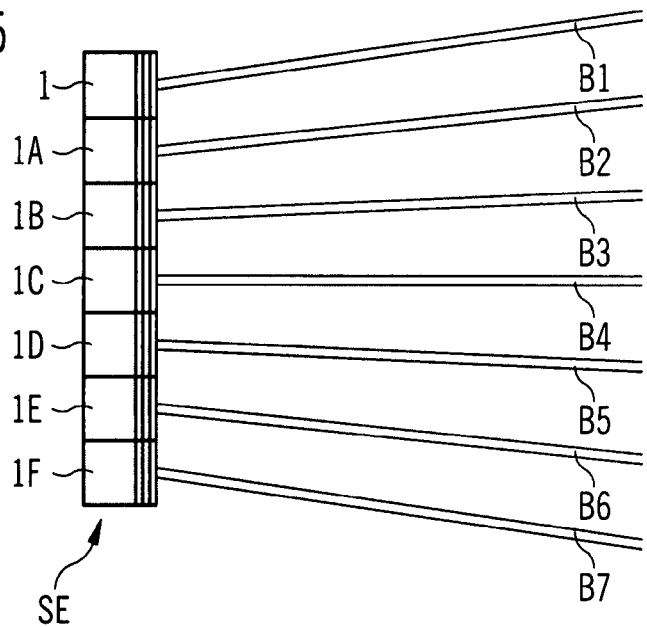
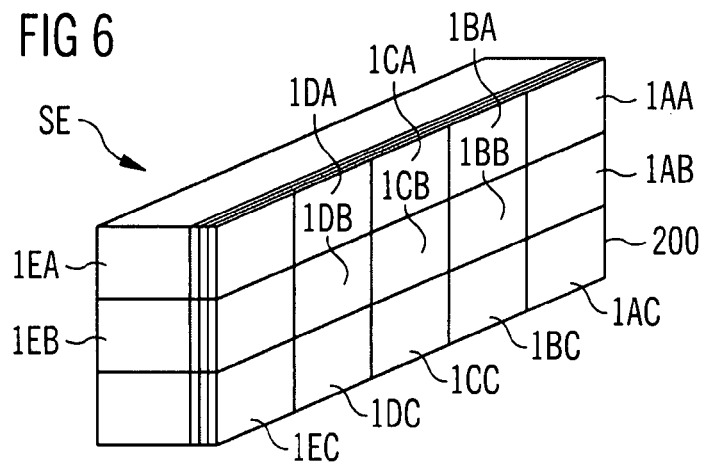
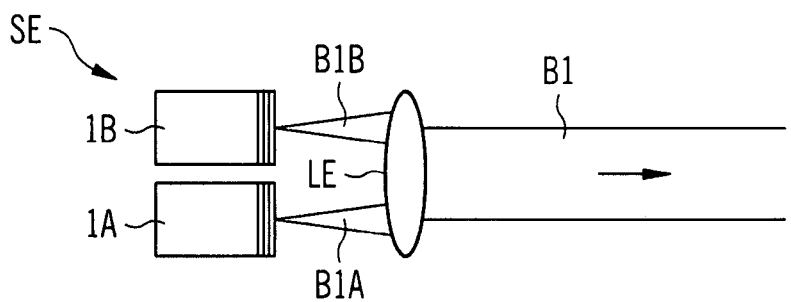

MEASURING ARRANGEMENT AND MEASURING SYSTEM

RELATED APPLICATIONS

This patent application claims the priority of German patent application nos. 10 2007 003 806.4 filed Jan. 25, 2007 and 10 2007 011 804.1 filed Mar. 12, 2007, the disclosure content of both of which is hereby incorporated by reference.

FIELD OF THE INVENTION

The present invention relates to a measuring arrangement and to a measuring system comprising the measuring arrangement.

BACKGROUND OF THE INVENTION

In measuring arrangements of this type, which can be used for example for distance measurement or for speed measurement, semiconductor laser components are used in many cases.

SUMMARY OF THE INVENTION

It is an object of the present invention to provide a measuring arrangement and a measuring system having increased efficiency which can be produced cost-effectively.

This and other objects are attained in accordance with one aspect of the invention directed to a measuring arrangement comprising a radiation device, having at least one first surface emitting semiconductor component with a vertical emission direction. In this case, the semiconductor component comprises a semiconductor body with a plurality of active regions suitable for generating radiation and arranged at a distance from one another in a vertical direction. A tunnel junction is monolithically integrated in the semiconductor body between two active regions from the plurality of active regions. The two active regions are electrically conductively connected by means of the tunnel junction during operation of the semiconductor component. The measuring arrangement furthermore comprises a detection device for detecting reflected radiation, and an evaluation circuit, set up for controlling the radiation device and the detection device and for processing a detection result of the detection device.

During operation of the measuring arrangement, for example under the control of the evaluation circuit, radiation, preferably laser radiation, is emitted by the semiconductor component of the radiation device. The radiation can be emitted in pulsed fashion, by way of example. If the radiation impinges on an obstacle or some other object which is opaque to the wavelength of the radiation, the emitted radiation is generally reflected. The reflection can take place in directional fashion or diffusely, such that part of the reflected radiation is reflected back in the direction of the detection device, which is arranged for example in the vicinity of the radiation device. However, the detection device can also be provided at a distance from the radiation device.

The reflected radiation can be detected by the detection device and forwarded for example as detection signal to the evaluation circuit. The detection result and the time that elapsed between the emission of the radiation by the radiation device and the detection of the reflected radiation in the detection device can be used, in association with the propagation speed of the radiation, which usually corresponds to the speed of light, for measuring the distance between the measuring arrangement and the reflecting object.

By means of the plurality of active regions, it is possible to increase the radiation power generated in the semiconductor body and by way of this advantageously likewise the radiation power coupled out from the semiconductor body. In particular, it is thus also possible to increase the radiation power coupled out from the semiconductor body relative to the area included in a radiation coupling-out area of the semiconductor component.

Furthermore, in the semiconductor component, on account of the plurality of active regions, the electrical resistance, for example the resistance of a Bragg mirror present only once, in the semiconductor body is distributed between a plurality of active regions, such that the resistance of the semiconductor body per active region is reduced in comparison with a semiconductor body having a smaller number of active regions. The resistance to be overcome by an operating current per active region can thus be reduced. The conversion efficiency of electrical power fed to the semiconductor body into radiation power is consequently increased.

Overall, the semiconductor component is accordingly distinguished by efficiency that can be increased in a simplified manner. This also has an effect on the efficiency of the measuring arrangement.

Preferably, two active regions are formed for generating radiation of the same wavelength. This can be achieved in a simplified manner by the active regions being embodied in the same way, for example by means of identical materials and/or the same structural construction of the active regions. As an alternative, the active regions are embodied for generating radiation of different wavelengths.

By means of the tunnel junction, the electro-optical conversion efficiency of charge carriers injected into the semiconductor body into radiation (photons) by means of the active regions that are electrically conductively connected via the tunnel junction, that is to say the efficiency of the electro-optical conversion, can be increased.

An electron that recombines in one active region with generation of radiation can tunnel through the tunnel junction, which is embodied for example as a tunnel diode that is reverse-biased in particular during operation of the semiconductor component in the forward direction with respect to the active regions, and pass into the other active region.

The tunnel junction is preferably formed in such a way that electrons can tunnel after radiative recombination from the valence band of one active region into the conduction band of the other active region and therefore again be used for generating radiation in the latter active region. A charge carrier can therefore be used multiply, that is to say in a plurality of active regions, for generating radiation.

The tunnel junction preferably has two tunnel semiconductor layers of different conduction types. Furthermore, the tunnel junction is preferably arranged in the semiconductor body between two semiconductor layers of the semiconductor body of different conduction types, which particularly preferably adjoin the tunnel junction. The semiconductor layers of the tunnel junction preferably have a higher dopant concentration than the respective semiconductor layer—adjoining the tunnel junction—of the semiconductor body of the respective same conduction type. Furthermore, the tunnel semiconductor layers of the tunnel junction preferably each adjoin a semiconductor layer of the semiconductor body which has the same conduction type as the adjoining tunnel layer.

In a further preferred configuration, a frequency-selective element is arranged between two of the active regions. The intensity distribution of radiation in the semiconductor body can be influenced by means of the frequency-selective element. Preferably, the intensity distribution is influenced in such a way that the intensity distribution, in particular the envelope curve thereof, is shaped in accordance with a predetermined intensity distribution or a predetermined curve. In particular, the intensity distribution can be influenced in such a way that the intensity which can be absorbed in an absorbing element, not formed for generating radiation, in the semiconductor body is reduced in comparison with a semiconductor body which is formed in the same way but in which the frequency-selective element is dispensed with. The radiation power absorbed in the semiconductor body can thus be reduced, whereby the radiation power coupled out is increased.

The frequency-selective element is particularly preferably arranged between the active regions which are electrically conductively connected via the tunnel junction. In the region of the tunnel junction, the radiation intensity can thus be reduced in a simplified manner on account of the relative spatial proximity to the frequency-selective element. A tunnel junction generally has a high absorbance for radiation generated in the semiconductor body, in particular through free charge carriers, such that a reduction of the intensity in the region of the tunnel junction by means of the frequency-selective element is particularly advantageous.

The frequency-selective element is preferably formed in such a way that the intensity of the generated radiation in the semiconductor body is reduced within the frequency-selective element. The tunnel junction is expediently surrounded by the frequency-selective element or embedded into the latter.

In a further preferred configuration, the semiconductor component has an internal resonator or is designed for operation with an external resonator. Preferably the semiconductor component is designed for operation as an electrically pumped semiconductor laser component with a resonator. Particularly preferably, the semiconductor component is designed for operation as a VCSEL (VCSEL: vertical cavity surface emitting laser) with an internal resonator.

During operation of the semiconductor component with resonator, there builds up in the resonator a radiation field, in particular a field of standing waves (standing wave field), which can be amplified at least in part by stimulated emission in the active regions. The amplified radiation can couple out as coherent laser radiation from the resonator.

In a further preferred configuration, the resonator is formed and preferably delimited by means of a first resonator mirror and a second resonator mirror. The first resonator mirror and/or the second resonator mirror can be embodied as Bragg mirror (resonator Bragg mirror), in particular monolithically integrated into the semiconductor body.

Mirrors by means of which the resonator is formed are preferably formed with a high reflectivity, for example of 99% or greater, for instance 99.9% or greater, one of the mirrors serving as a coupling-out mirror for coupling out radiation from the resonator and for this purpose preferably having a correspondingly lower reflectivity. In this case, the reflectivity of the coupling-out mirror is expediently chosen to have a magnitude such that laser activity can be achieved during the operation of the component.

The resonator is preferably formed as a common resonator for a plurality of active regions, for example two or more active regions, which are in each case formed as amplifying regions for radiation in the semiconductor body and are arranged within the resonator that is common to said active regions. This preferably concerns the two active regions between which the frequency-selective element and/or the tunnel junction are arranged. The gain can be increased by means of a plurality of amplifying regions in a common resonator. A threshold current required for achieving the laser activity, or a corresponding threshold current density can advantageously be reduced as a result of this. Furthermore, with the pumping current remaining the same, the radiation power generated in the semiconductor body can be increased.

Alternatively or supplementarily, the reflectivity of a resonator mirror can be reduced, in which case laser activity can still be reliably achieved despite the reduced reflectivity on account of the increased gain. In this case, the reflectivity of the coupling-out mirror is expediently reduced, such that the radiation power coupled out from the resonator can be increased without critically increasing the threshold current.

A pumping current for electrically pumping the semiconductor component can flow through the first resonator mirror and/or the second resonator mirror. Preferably, at least one resonator mirror is doped, such that the pumping current can be conducted via the doped resonator mirror with advantageously low resistance.

On account of the plurality of active regions, the electrical resistance in the resonator or in the semiconductor body, in particular that of a resonator mirror conducting the pumping current, is distributed between said active regions. Consequently, the electrical resistance to be overcome by the pumping current in the semiconductor body relative to the number of active regions is reduced in comparison with a semiconductor component having a smaller number of active regions. The conversion efficiency is thus increased.

A Bragg mirror preferably comprises a plurality of layers, in particular semiconductor layers, having different refractive indices, the layers being stacked one on top of another. These layers are preferably embodied in each case as a $\lambda/4$ layer for a radiation of wavelength $\lambda$ which is to be emitted by the semiconductor component and in particular is to be amplified in the resonator.

For a Bragg mirror involved in forming the resonator, for example fifty or more layers may be required in order to ensure that the laser activity is achieved. The electrical resistance of a Bragg mirror generally increases with the number of layers on account of the increasing number of interfaces. Therefore, a resonator mirror embodied as a Bragg mirror often has a comparatively high resistance. The resistance of a semiconductor component with a resonator Bragg mirror monolithically integrated into the semiconductor body can therefore be significantly determined by the electrical resistance of said Bragg mirror conducting the pumping current. On account of the high resistance of the mirror, the required electrical pumping power also accordingly increases in accordance with $P=RI^2$ with the electrical power P, the current I and the resistance R, since a significant power drop occurs at the Bragg mirror. On account of the plurality of active regions to which a common pumping current can be fed via the Bragg mirror, the resistance of the semiconductor component per active region is reduced, whereby the conversion efficiency can be increased.

In a further preferred configuration, the first resonator mirror and the second resonator mirror have one of the following configurations: identical conduction type, different conduction type. If the resonator mirrors have the same conduction type, then a conduction type which is advantageous for the semiconductor component is expediently chosen. In n-conducting semiconductor materials, the absorption of radiation generated in the semiconductor body at free charge carriers is generally—compared with p-conducting semiconductor materials—advantageously low. Preferably, therefore, both resonator mirrors are embodied in n-conducting fashion and in particular as Bragg mirrors.

In an advantageous development, an, if appropriate additional, tunnel junction is monolithically integrated in the semiconductor body between a resonator mirror and the active region closest to the latter. This facilitates the use of two resonator Bragg mirrors of the same conduction type, without significantly impeding the feeding of current to the active regions on account of a critically blocking pn junction that otherwise forms.

In comparison with resonator Bragg mirrors of the same conduction type, a semiconductor body with monolithically integrated resonator Bragg mirrors of different conduction types can be manufactured in a simplified manner and in particular for the most part in a standard fashion.

In a further preferred configuration, two active regions comprise a quantum well structure. A single or multiple quantum well structure is distinguished by particularly high internal quantum efficiency in the generation of radiation in the respective active region. In this case, the designation quantum well structure does not comprise any indication about the dimensionality of the quantization. It therefore encompasses, inter alia, quantum wells, quantum wires and quantum dots and any combination of these structures.

In a further preferred configuration, the semiconductor body is formed in such a way that the radiation field that forms during operation of the semiconductor component within the resonator and in particular is to be amplified in the semiconductor body has an intensity minimum (intensity node) within the tunnel junction that electrically conductively connects the two active regions of the semiconductor body, in particular in series. This preferably concerns a, preferably predetermined, mode of the standing wave field that is to be amplified.

As an alternative or in addition, the semiconductor body can be formed correspondingly for the tunnel junction connected downstream of a Bragg mirror, as described above. An intensity minimum of the standing wave field can therefore also be arranged in this, if appropriate additional, tunnel junction.

On account of the radiation intensity that can be reduced by means of the frequency-selective element in the region of the tunnel junction, only a comparatively low radiation power can be absorbed in the tunnel junction. Even when the tunnel junction is formed in the semiconductor body slightly outside an intensity minimum of the standing wave field, the radiation power that can be absorbed in the tunnel junction can thereby be kept within acceptable limits in a simplified manner without the efficiency or the laser properties of the semiconductor component being significantly impaired. Thus, by way of example, the threshold current can be kept comparatively low in a simplified manner despite an absorbing tunnel junction that electrically couples the active regions to one another.

In the arrangement of the tunnel junction or the production of the semiconductor body, which is preferably grown epitaxially on a growth substrate, the manufacturing tolerance is therefore increased on account of the intensity modulation by means of the frequency-selective element, without the efficiency being significantly reduced. A deviation from the arrangement of the tunnel junction around an intensity node leads, in particular, only to a moderate increase in the absorbed radiation power.

In a further preferred configuration, the frequency-selective element comprises a Bragg mirror and particularly preferably a further Bragg mirror. The semiconductor body can therefore comprise, in particular, in addition to a (the) resonator Bragg mirror(s), a further Bragg mirror, which is preferably embodied as a Bragg mirror monolithically integrated in the semiconductor body. The Bragg mirror(s) of the frequency-selective element is (are) preferably arranged between two active regions of the semiconductor body.

The frequency-selective element is preferably free of an active region, such that preferably no active region is arranged in particular between the Bragg mirrors of the frequency-selective element.

By means of the frequency-selective element, additional phase conditions for the radiation field within the resonator are created in particular by means of reflection at the Bragg mirrors. The intensity of the standing wave field in the resonator can be reduced in a simplified manner between the Bragg mirrors of the frequency-selective element. In particular, this concerns a lowering of the envelope curve of the intensity distribution of the standing wave field in the semiconductor body within the frequency-selective element in comparison with a semiconductor body without a frequency-selective element.

The envelope curve of the intensity distribution of the radiation field can therefore be shaped and modified in a targeted manner by means of the frequency-selective element. The envelope curve of the intensity distribution, in particular of a for example longitudinal mode to be amplified in the resonator, can be shaped in such a way that it has a local minimum between the active regions—in particular those between which the frequency-selective element is arranged—within the frequency-selective element, between the Bragg mirrors of the element and/or in the region of the tunnel junction.

As an alternative or in addition, a local maximum of the envelope curve can be shifted in a targeted manner by means of the frequency-selective element, for example to outside the region between two active regions.

As an alternative or in addition, the frequency-selective element can be embodied for, in particular longitudinal, mode selection. The selection of a predetermined mode to be amplified in the resonator can thus be simplified. In this case, the frequency-selective element preferably increases the losses for modes that are not to be amplified in the resonator. A longitudinally monomode operation of the semiconductor element can thus be achieved in a simplified manner.

The frequency-selective element is preferably formed in such a way as to avoid the formation of a subresonator, that is to say of a separate resonator for an active region of a pair of active regions, in the semiconductor component. For this purpose, the Bragg mirror(s) of the frequency-selective element is (are) expediently formed for the radiation of wavelength $\lambda$ to be amplified in the resonator with such low reflectivities that an oscillation build-up of modes which are not associated with the common resonator is avoided.

A reflectivity of 95% or less, preferably 90% or less, particularly preferably 80% or less, is particularly suitable for this. The reflectivity of the Bragg mirror and/or of the further Bragg mirror is furthermore preferably greater than 30%, particularly preferably greater than 40%. Such reflectivities are particularly suitable for the intensity modulation. The lower the reflectivity of the individual mirrors for the radiation generated, the lower, too, the risk of oscillation build-up of subresonator modes. The greater the reflectivity, the better, however, the intensity distribution can be influenced.

In a further preferred configuration, the tunnel junction that electrically conductively connects the two active regions is arranged between the two Bragg mirrors of the frequency-selective element. Preferably, tunnel semiconductor layers of the tunnel junction respectively adjoin the layers of the corresponding Bragg mirror.

Furthermore, the Bragg mirrors of the frequency-selective element preferably have different conduction types. The frequency-selective element can be in particular monolithically integrated in the semiconductor body. Structural modifications to the frequency-selective element are advantageously not necessary after the growth of layers for Bragg mirrors of the frequency-selective element for the frequency selection.

In a further preferred configuration, a current constriction element is formed between two active regions, preferably in a manner integrated in the frequency-selective element, particularly preferably in a manner integrated in a Bragg mirror of the frequency-selective element. The current flow in the semiconductor body can be guided, by means of an electrically insulating current blocking region of the current constriction element, laterally in the direction of an electrically conductive, current-carrying aperture of the current constriction element and be conducted in a vertical direction through said aperture. By means of the current constriction element, the current flow is concentrated in a lateral direction and, in particular, the current path is constricted. The charge carrier flow between the active regions can be constricted in a lateral direction by means of the current constriction element, thereby preventing current spreading between the active regions. The current density in the semiconductor body can be increased by constriction by means of the current constriction element, whereby a threshold current density required for achieving the laser activity can be achieved in a simplified manner.

Preferably, the current constriction element is integrated in a p-conducting semiconductor region of the semiconductor body, for example in a p-conducting Bragg mirror of the frequency-selective element. In conventional semiconductor laser components, a current constriction element is often formed within a p-conducting semiconductor region, in particular a p-conducting resonator Bragg mirror. The integration of an additional current constriction element in a semiconductor region between the active regions, in particular a p-conducting Bragg mirror of the frequency-selective element, can thus be realized in a simplified manner in the same material environment, that is to say in layers of the same composition and/or doping, as the current constriction element provided anyway in the semiconductor body. Since a current constriction element is often formed as an oxide constriction element by means of lateral oxidation of a semiconductor layer, two current constriction elements having a current-conducting aperture of identical size can thus be formed in a simplified manner.

In a further preferred configuration, the semiconductor body is formed in such a way that an active region is arranged in a targeted manner outside an intensity maximum of the radiation field in the resonator in such a way that said intensity maximum lies within an n-conducting semiconductor region of the semiconductor body, which preferably adjoins the active region, or is shifted in the direction thereof. This can be achieved by forming the semiconductor body in a suitable manner. The intensity maximum is preferably the intensity maximum closest to the active region, in particular of a mode to be amplified in the active regions.

In a further preferred configuration, the semiconductor body, in particular the tunnel junction, the active regions and/or the frequency-selective element contains a III-V semiconductor material, in particular a material from the III-V semiconductor material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$, and/or a material from the semiconductor material systems InGaAsN, InGaAsSb, InGaAsSbN or $In_xGa_{1-x}As_yP_{1-y}$ where $0 \leq x \leq 1$, $0 \leq y \leq 1$, in each case $x \neq 0$ and/or $y \neq 0$ preferably holding true for the specified parameters x and y. Furthermore, it is preferably the case that $x \neq 1$ and/or $y \neq 1$. III-V semiconductor materials may be distinguished by particularly high quantum efficiencies in the generation of radiation and simplified producibility of a semiconductor body for the semiconductor component. With the material systems mentioned, radiation can be generated particularly efficiently in different spectral ranges. In this case, $In_xGa_yAl_{1-x-y}N$ is particularly suitable for ultraviolet radiation, through blue to green radiation, $In_xGa_yAl_{1-x-y}P$ is particularly suitable for yellow to red radiation, and $In_xGa_yAl_{1-x-y}As$ is particularly suitable for infrared radiation.

In an embodiment of the measuring arrangement, the detection device comprises at least one first photosemiconductor element. By way of example, the at least one first photosemiconductor element is embodied as a photodiode or as a phototransistor or as a photoresistor. In the case of a photosemiconductor element, the impingement of energy-carrying radiation particles, for example photons, raises electrons at a pn junction of the photosemiconductor element to a higher energy level. Free charge carriers generated in this way enable a current flow or an altered current flow through the photosemiconductor component, which can be forwarded as a detection result to the evaluation circuit.

In the case of a photodiode, which is usually reverse-biased, impinging photons can thus be detected by a current flow through the photodiode being established, which can be measured for example in the detection device and is processed as a detection result in the evaluation circuit.

In the case of a phototransistor, the controlled path of the transistor is switched on depending on the impingement of light particles, the reflected radiation comprising the light particles in this exemplary embodiment. Consequently, a switching operation of the phototransistor can be evaluated as a detection result for the detection of the reflected radiation.

In the case of a photoresistor, the electrical resistance of the component is altered with the impingement of light particles. This alteration can be detected for example by applying a voltage or a current to the photoresistor.

The detection device can also comprise a plurality of photosemiconductor components, such as, for example, a multiplicity of photodiodes or a multiplicity of phototransistors or else a combination of different photosemiconductor components.

In a further embodiment of the measuring arrangement, the latter comprises a second detection device for detecting reflected radiation, which is coupled to the evaluation circuit for control and processing of the detection result. By means of the second detection device, for example reflections of radiation at an object, which take place diffusely or in directional fashion, can also be detected at a plurality of locations of the measuring arrangement. Moreover, the detection reliability can be increased since detection of reflected radiation is possible even when one of the two detection devices is optically concealed, for example.

In a further embodiment of the measuring arrangement, the latter can also have a larger number of detection devices.

In an embodiment of the measuring arrangement, the radiation device comprises a plurality of surface emitting semiconductor components corresponding to the first surface emitting semiconductor element. By way of example, the plurality of surface emitting semiconductor components are in this case arranged as a one-dimensional or two-dimensional radiation field.

In the case of a one-dimensional radiation field, the plurality of surface emitting semiconductor components can be arranged along a line or a curve. By way of example, the plurality of semiconductor components have different emission angles, such that measurements can be carried out in a spread-out range. In an embodiment, the surface emitting semiconductor components are designed for emitting radiation of different wavelengths. Consequently, a radiation emission can be effected simultaneously by the plurality of semiconductor components, the radiations of different wavelengths being detected for example by different detectors or detection devices which are set up for the different wavelengths.

In the case of a two-dimensional radiation field, by way of example, the radiation-emitting surfaces of the semiconductor components are arranged to form a planar or curved area. In a manner similar to that in the case of the one-dimensional radiation field, the semiconductor components can have different radiation angles with respect to one another. By way of example, a surface structure of an object can thus be measured.

For the semiconductor components in a one-dimensional or two-dimensional radiation field, a radiation emission of the surface emitting semiconductor components can be individually controllable. By way of example, the individual semiconductor components of the radiation field are in each case driven successively for the emission of a radiation pulse. A reflected radiation can be detected by means of a single detection device or by means of a plurality of detection devices. In this case, a time interval between emitted radiation pulses preferably corresponds approximately to a time derived from the distance between the measuring arrangement and the expected reflecting object in order to be able to unambiguously assign the detection of a reflected radiation pulse to a respective one of the surface emitting semiconductor components.

In a further embodiment of the measuring arrangement, a radiation emission of the plurality of surface emitting semiconductor components is effected in concentrated fashion. By way of example, a plurality of semiconductor components are provided which are driven synchronously with the radiation emission in order to increase a radiation power of the radiation device, in which case the individual radiations can be concentrated for example by means of a lens.

In a further embodiment of the measuring arrangement, provision is made of at least one optical element for beam shaping and/or for beam guiding of the radiation emitted by the semiconductor component or by the radiation device. The optical element can have at least one of the following elements: a mirror, an optical slit, an optical grating, a lens, an optical fiber.

A radiation emitted by the radiation device can be deflected in its direction by means of a mirror. In this case, the mirror can be fitted fixedly in order to achieve a predetermined, fixed emission angle. As an alternative, the mirror can also be fitted in movable fashion in order to achieve a spatial or linear deflection of the emitted radiation.

A diffractive deformation of the radiation of the radiation device can be effected by an optical slit or by an optical grating. This can bring about an expanding or concentrating deformation of the radiation. By way of example, a collimated, that is to say concentrated beam can be generated by means of a lens.

By means of an optical fiber, the radiation emitted by the radiation device can be guided to another location for the actual radiation emission. By way of example, this enables the actual generation of radiation to be provided independently of the desired emission location of the emitted radiation, such as, for example, in a separate protected region.

In an embodiment of a measuring system, the latter comprises a measuring arrangement according to one of the exemplary embodiments described and is set up for distance measurement. As an alternative or in addition, a measuring system comprising a measuring arrangement according to one of the exemplary embodiments described is also set up for speed measurement. By way of example, the measuring arrangement can be used to measure distances or spacings with respect to an object at different points in time. From the measured distances and the time interval between the measurements it is therefore possible to determine a speed or relative speed of the measured object with respect to the measuring arrangement or with respect to the measuring system.

In an embodiment of a measuring system, the latter comprises a measuring arrangement according to one of the exemplary embodiments described and is formed as an adaptive cruise control. An adaptive cruise control, ACC, can be used in a vehicle, for example, in order to automatically adapt the speed of the vehicle depending on a distance with respect to a vehicle ahead and with respect to a speed of the vehicle ahead.

BRIEF DESCRIPTION OF THE DRAWINGS

FIG. 5 shows a first exemplary embodiment of a radiation device, FIG. 6 shows a second exemplary embodiment of a radiation device, FIG. 7 shows a third exemplary embodiment of a radiation device.

DETAILED DESCRIPTION OF THE DRAWINGS

Figure 1:
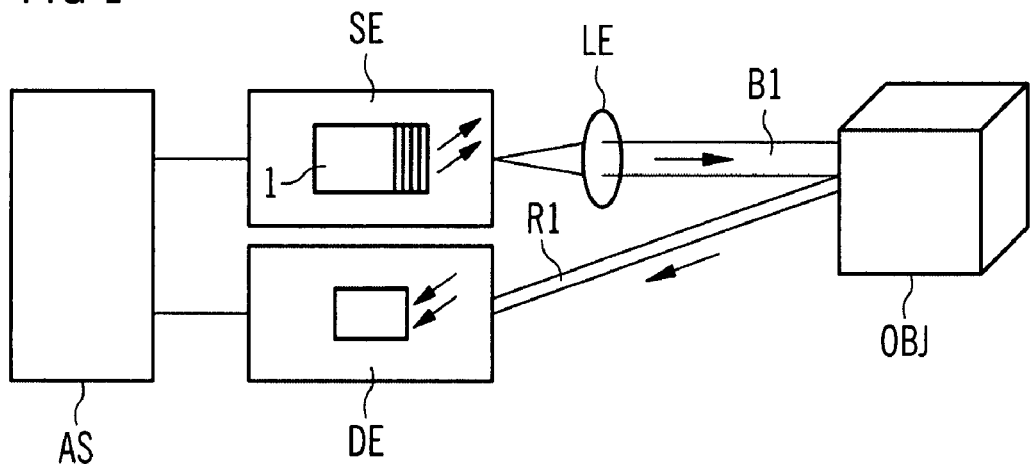
FIG. 1 shows a first exemplary embodiment of a measuring arrangement.

FIG. 1 shows an exemplary embodiment of a measuring arrangement having an evaluation circuit AS, a radiation device SE and a detection device DE. The evaluation circuit AS is coupled to the radiation device SE and the detection device DE for the control of the devices SE, DE and for the processing of a detection result of the detection device DE. The radiation device SE has at least one first surface emitting semiconductor component 1 with a vertical emission direction which comprises a plurality of active regions arranged at a distance from one another in a vertical direction. During operation, a radiation, for example a laser radiation, emerges from the radiation device SE and is concentrated by a lens LE to form a beam B1.

FIG. 1 furthermore illustrates an object OBJ, which, however, is not part of the measuring arrangement. During operation, the radiation B1 impinges on the object OBJ and is reflected there as radiation R1. The reflected radiation R1 impinges on the detection device DE, which comprises for example a photosemiconductor component for detecting the reflected radiation.

However, usually the radiation B1 is not emitted permanently. Rather, the evaluation circuit AS is set up for controlling a radiation emission of the first surface emitting semiconductor component 1 or of the radiation device SE in pulsed fashion.

In the detection device DE, the detected reflected radiation R1 is converted for example into a current or into charge, which are evaluated as a detection result in the evaluation circuit AS. The evaluation circuit AS can determine for example a time interval between the emission of the radiation pulse B1 and the detection of the reflected radiation R1. By way of the propagation speed of the radiation B1, R1, which usually corresponds virtually to the speed of light, a spatial distance between the measuring arrangement and the measurement object OBJ can be determined from the time interval determined. The measuring arrangement is thus suitable in particular for distance measurement.

However, by emitting a pulse sequence of radiation pulses, it is also possible to determine speeds or relative speeds between the measuring arrangement and the measurement object on the basis of a distance that varies in a specific time. Furthermore, it is also possible to evaluate a frequency shift in the reflected radiation R1 according to the Doppler principle. It is also possible to modulate the laser radiation in order to measure a distance or a speed in this way.

Figure 2A:
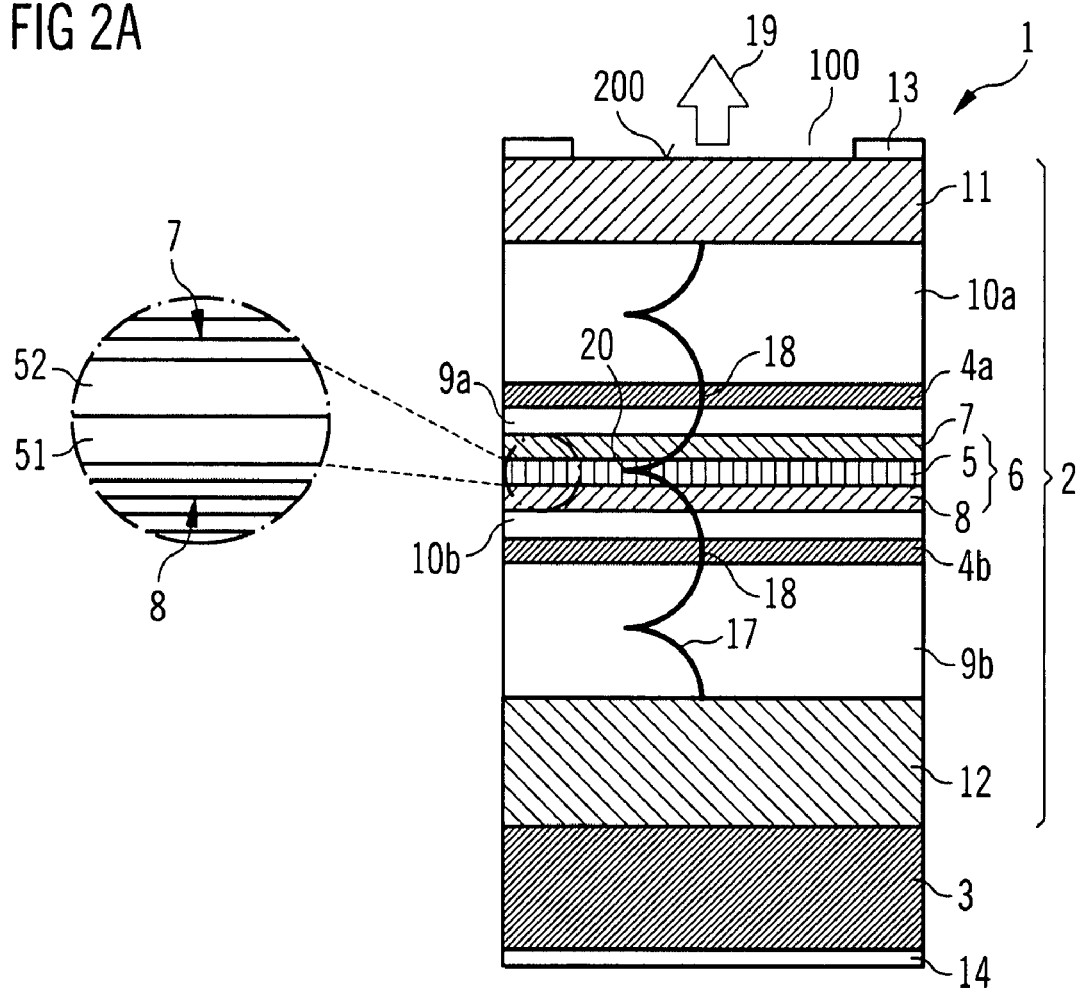
FIG. 2A shows a first exemplary embodiment of a surface emitting semiconductor component.

FIG. 2A shows a schematic sectional view of an exemplary embodiment of a radiation-emitting semiconductor component 1 which can be used in the radiation device SE from FIG. 1. The radiation-emitting semiconductor component 1 is embodied as an electrically pumped semiconductor laser component, in particular as a VCSEL with an internal resonator. The semiconductor component 1 comprises a semiconductor body 2 arranged on a substrate 3 which advantageously mechanically stabilizes the semiconductor body. The semiconductor body 2 is preferably embodied in monolithically integrated fashion and is particularly preferably grown epitaxially on the substrate 3, which then comprises the growth substrate or is formed from the latter.

The semiconductor body 2 comprises two active regions 4a and 4b suitable for electroluminescent radiation generation. Said active regions are arranged at a distance from one another and preferably adjacent to one another in the semiconductor body. The active regions 4a and 4b are electrically conductively connected in series by means of a tunnel junction 5 formed and arranged between said active regions in the semiconductor body. The tunnel junction 5 is embedded into a frequency-selective element 6, which is arranged between the active regions 4a and 4b, and in particular is surrounded by the frequency-selective element.

The frequency-selective element 6 comprises a first Bragg mirror 7 and a second Bragg mirror 8, which are arranged between the active regions 4a and 4b in the semiconductor body 2 and are preferably monolithically integrated in the semiconductor body. The tunnel junction 5 is arranged in particular between the Bragg mirrors 7 and 8 of the frequency-selective element and likewise preferably implemented in a manner monolithically integrated into the semiconductor body. There is preferably no active region arranged within the frequency-selective element and in particular between the Bragg mirrors 7 and 8 of the frequency-selective element 6.

The active regions 4a and 4b are in each case arranged between two semiconductor regions—the semiconductor regions 9a and 10a in the case of the active region 4a, and respectively the semiconductor regions 9b and 10b in the case of the active region 4b—the semiconductor regions surrounding an active region preferably having, in particular in each case, different conduction types—n-conducting or p-conducting. The semiconductor regions are expediently doped correspondingly for this purpose.

Preferably, the semiconductor regions arranged on the corresponding, in particular the same, side of the respective active region have the same conduction type. In particular, the semiconductor regions 9a and 9b, for example n-conducting, and respectively the semiconductor regions 10a and 10b, for example p-conducting, preferably have the same conduction types in each case.

A resonator of the semiconductor component 1 is formed by means of a first resonator end mirror 11 and a second resonator end mirror 12, between which the two active regions 4a and 4b are arranged and which preferably delimit the resonator. The resonator end mirrors are preferably applied on the active regions, whereby in particular an internal resonator is formed.

The first resonator end mirror 11 and/or the second resonator end mirror 12 are/is preferably formed as a resonator Bragg mirror monolithically integrated in the semiconductor body 2 and, particularly preferably, the first resonator end mirror and/or the second resonator end mirror are/is doped. The respective doped resonator Bragg mirror preferably has the same conduction type as a semiconductor region arranged between the respective resonator Bragg mirror and the closest active region. Accordingly, the first resonator end mirror 11 is preferably embodied in p-conducting fashion (in accordance with the semiconductor region 10a) and the second resonator end mirror 12 is preferably embodied in n-conducting fashion (in accordance with the semiconductor region 9b).

Furthermore, the first Bragg mirror 7 and/or the second Bragg mirror 8 of the frequency-selective element 6 are/is preferably doped. The first Bragg mirror 7 preferably has the same conduction type as the semiconductor region 9a adjoining the Bragg mirror in particular on that side of the Bragg mirror 7 which is remote from the tunnel junction 5. The same correspondingly holds true for the second Bragg mirror 8 of the frequency-selective element 6 with regard to the semiconductor region 10b arranged, in particular, between the two active regions. Accordingly, the first Bragg mirror 7 is preferably embodied in n-conducting fashion and the second Bragg mirror 8 is preferably embodied in p-conducting fashion.

The active regions 4a and 4b are electrically conductively connected to one another via the frequency-selective element 6 and the tunnel junction 5 arranged between the active regions, and furthermore to a first contact 13 and also a second contact 14 of the semiconductor component 1. During operation of the semiconductor component, charge carriers can be injected into the semiconductor body 2 via the contacts 13 and 14, which charge carriers can recombine in the active regions 4a and 4b with generation of radiation.

The first contact 13, for example a contact metallization is preferably arranged on that side of the semiconductor body 2 which is remote from the substrate 3, and if, as in the case of a top emitter illustrated, an emission surface 200 of the semiconductor body 2 is arranged on that side of the semiconductor body which is remote from the substrate 3, the first contact is expediently cut out for the passage of radiation and embodied for example as an annular contact. The second contact 14, for example a contact metallization, is preferably arranged on that side of the substrate 3 which is remote from the semiconductor body 2. For transmitting current, the substrate 3 is preferably embodied in electrically conductive fashion, for example by corresponding doping.

An aperture 100 of the annular contact for the passage of radiation can be embodied in circle-like or ellipse-like fashion in a plan view of the emission surface 200 of the semiconductor body 2. An ellipse-like embodiment is particularly suitable for influencing the polarization for a radiation 19 emerging from the semiconductor body 2, for example infrared radiation.

Charge carriers which recombine radiatively in one of the active regions can pass into the other active region after tunneling through the tunnel junction 5. The tunnel junction 5 is preferably formed in such a way that charge carriers tunnel after recombination in one active region from the valence band of this active region into the conduction band of the other active region and recombine radiatively again in the latter. The conversion efficiency of the semiconductor component in the conversion of electrical power into radiation power is thus advantageously increased since a charge carrier can be used multiply, that is to say in a plurality of active regions, for generating radiation.

A radiation field of standing waves (standing wave field) builds up in the resonator by means of reflection at the resonator end mirrors. Said radiation field, in particular a mode of the field, can be amplified by stimulated emission in the active regions 4a and 4b. The amplified coherent laser radiation 19 can couple out from the resonator via a resonator end mirror serving as coupling-out mirror, the resonator end mirror 11 in the present case, from the semiconductor body 2 of the semiconductor component 1 in a vertical direction, that is to say perpendicular to a lateral main area of the active regions which are preferably arranged parallel to one another.

The semiconductor body 2 of the semiconductor component 1 is preferably based on (In, Al)GaAs, particularly preferably on (Al)GaAs. Materials of this type are particularly suitable for efficiently generating radiation, in particular infrared radiation. Infrared radiation is suitable for example for use in laser-based measuring systems, for which the semiconductor component is preferably provided, and for data transmission.

The resonator end mirrors 11 and 12 preferably have a high reflectivity, for example of 97% or greater, in particular 99% or greater, for instance 99.9%, for radiation of wavelength $\lambda$ to be amplified in the active regions. The reflectivity of a resonator mirror serving as coupling-out mirror is preferably lower than that of the further resonator mirror, the second resonator end mirror 12 in the present case.

A Bragg mirror of the semiconductor component—the first resonator Bragg mirror 11, the second resonator Bragg mirror 12, the first Bragg mirror 7 of the frequency-selective element and/or the second Bragg mirror 8 of the frequency-selective element 6—preferably has a multiplicity of semiconductor layers, for example 55 or more semiconductor layers for a resonator end mirror, having different refractive indices. These are preferably based in each case on (Al)GaAs. Such a high number of layers is often necessary for obtaining a predetermined reflectivity, in particular of the resonator end mirrors 11 and 12, respectively, which suffices for achieving the laser activity, for example of 99.8% or greater. The semiconductor layers of a Bragg mirror of the semiconductor component are furthermore preferably embodied in each case as $\lambda/4$ layers for radiation of wavelength $\lambda$ to be amplified in the active regions 4a and 4b.

In order to reduce the number of layers in a Bragg mirror with the reflectivity remaining the same, materials with an advantageously high refractive index difference, for example AlAs and GaAs, are preferably used for the different semiconductor layers of the Bragg mirror. The electrical resistance of the Bragg mirror can thus advantageously be kept low on account of the comparatively small number of layers. The Bragg mirror can comprise semiconductor layer pairs having individual layers having different refractive indices which are arranged alternately in such a way that a layer having a high refractive index is followed by a layer having a low refractive index. Alternatively or supplementarily it is possible to use mirror structures in which one or a plurality of $\lambda/4$ layers have a material gradient, for example a gradient in the Al content.

The pumping current for electrically pumping the semiconductor component is injected into the semiconductor body via the contacts 13, 14, the resonator end mirrors 11 and 12 and preferably the substrate 3.

On account of the multiplicity of layers, resonator Bragg mirrors 11 and 12 make a high contribution to the total electrical resistance of the semiconductor body 2. Since, on account of the plurality of active regions, the resistance of said Bragg mirrors is distributed between said regions, the conversion efficiency of the semiconductor component 1 of electrical power into radiation power can be increased in comparison with a component having only one active region in the semiconductor body.

As an alternative or supplementarily, it is also possible for the pumping current not to be conducted via the resonator Bragg mirror 11 and/or 12 or the substrate 3 to the active regions. This necessitates one or a plurality of so-called intra-cavity contacts, that is to say a contact by means of which current is injected into the semiconductor body within the resonator, in particular between a resonator end mirror and the active region closest to the latter. The resistance to be overcome by the pumping current can thus be reduced. A resonator end mirror downstream of which the intra-cavity contact is disposed can then be embodied, if appropriate, as an undoped Bragg mirror. As an alternative, an electrically insulating, dielectric mirror layer stack, which is preferably formed on the semiconductor body, can also be used as resonator end mirror.

The tunnel junction 5 is preferably embodied as a diode that is reverse-biased during operation of the semiconductor component in the forward direction for the active regions 4a and 4b, in particular with regard to the contacts 13 and 14.

The tunnel junction comprises for example two tunnel layers 51 and 52 of different conduction types. The tunnel layer 52 preferably has the same conduction type, in particular n-conducting, as a semiconductor layer of the Bragg mirror 7 which adjoins the tunnel junction 5 at the side of the tunnel layer 52, that is to say at that side of the tunnel layer 52 which is remote from the tunnel layer 51. The tunnel layer 52 particularly preferably has a higher dopant concentration (for example $n^+$) than said adjoining semiconductor layer. The same correspondingly holds true for the tunnel layer 51 (for example $p^+$) with regard to an, in particular p-conducting, semiconductor layer of the Bragg mirror 8 of the frequency-selective element which adjoins the tunnel junction 5 at the side of said tunnel layer 51.

The tunnel layers 51 and 52 preferably each have a thickness of 30 nm or less, particularly preferably 20 nm or less. The tunnel layers 51 and 52 can have a dopant concentration of, for example, $5 \times 10^{19}$ $cm^{-3}$ or more, preferably of $1 \times 10^{20}$ $cm^{-3}$ or more. (Al)GaAs layers having an Al content of 20% or less are particularly suitable for the respective tunnel layer.

The resonator length is preferably $n^*(\lambda/2)$, where $\lambda$ denotes the wavelength of the radiation to be amplified in the resonator and n denotes a natural number. n is preferably greater than or equal to 3. n is furthermore preferably chosen in such a way that the resonator length is less than or equal to 6λ per active region of the semiconductor component.

The elements of the semiconductor body 2 which are arranged within the resonator, that is to say all the semiconductor elements apart from the resonator end mirrors, can have—apart from the active regions 4a and 4b—the same material composition apart from, if appropriate, different conduction types and/or dopant concentrations. In particular, the tunnel junction 5 and the adjoining semiconductor elements can have the same composition apart from the dopant concentration. Refractive index jumps within these elements in the common resonator with associated increased reflection at interfaces can thus be reduced.

As an alternative, different materials in each case can be used for the elements arranged within the resonator, that is to say in particular for the tunnel junction and the adjoining semiconductor elements. The degrees of freedom for the embodiment of these elements are thus increased.

Combinations of such identical type of embodiment and different embodiment of the individual semiconductor elements in the resonator are also possible. By way of example, all the elements between the resonator end mirror 12 and the tunnel junction 5, if appropriate including the tunnel junction, apart from the active region arranged there, can have the same material composition. The elements of the semiconductor body 2 which are arranged between the tunnel junction 5 and the resonator end mirror 11 can have different material compositions.

Furthermore, the active regions are preferably formed in the same way, in particular with the same materials and/or the same structural construction. Preferably, the active regions are embodied for generating radiation of the same wavelength. As an alternative, the active regions are embodied for generating radiation of different wavelengths.

Preferably, the active regions furthermore each comprise a single or multiple quantum well structure. These structures are distinguished by particularly high internal quantum efficiencies in the conversion of electrical power into radiation power. The amplification of radiation in the semiconductor body relative to the charge carrier density can thus be increased in a simplified manner.

The semiconductor body is furthermore preferably formed in such a way that an intensity maximum (intensity antinode) 18 of an intensity distribution of the radiation field that forms in the resonator and is to be amplified in the active regions, in particular of a predetermined mode of said radiation field, is in each case arranged in the active region 4a and 4b, respectively. The intensity distribution 17 in the resonator is only illustrated schematically and in normalized fashion in FIG. 1.

The radiation field in the resonator is shown in FIG. 2A. A person skilled in the art knows that a standing wave field forms within a resonator. This standing wave field has antinodes that are arranged at a distance which corresponds to the half wavelength (which is the wavelength in the material, not the vacuum wavelength) of the radiation to be amplified ("the predetermined mode"). Hence, the idea is to place the active regions with respect to the radiation in the resonator in such a way that the active regions are located in or at least near antinodes in order to maximize the interaction between the radiation of the particular predetermined mode and the active regions.

As an alternative or in addition, one or a plurality of active regions can also be arranged in a targeted manner outside an intensity antinode. For this purpose, it is possible to reduce the thickness of a p-conducting region in regions of comparatively high radiation intensity in the semiconductor body and to correspondingly increase the thickness of an n-conducting region, in particular for a predetermined resonator length. In a p-conducting region, the absorption of radiation by free charge carriers is often particularly great and, in particular, greater than in an n-conducting region. This holds true in particular in the AlGaAs material system.

The respective active region is preferably arranged offset relative to the closest intensity antinode in such a way that the latter is shifted in the direction of an n-conducting semiconductor region or lies in the latter. For this purpose, an, if appropriate additional, n-conducting region, for example the Bragg mirror 7 or the semiconductor region 9a, can be made correspondingly thicker. By this means, too, the efficiency of the semiconductor component can advantageously be increased despite the arrangement of the active region outside an intensity antinode since radiation in the resonator passes through p-conducting semiconductor material more briefly.

The semiconductor body 2 is furthermore preferably formed in such a way that an intensity node 20 of the intensity distribution 17 is arranged within the tunnel junction 5. The absorption of radiation by free charge carriers in the tunnel junction 5, which in this regard generally exhibits a comparatively high absorbance, can thus be reduced. As a result of this, the conversion efficiency and, in particular, also the radiation power coupled out via the emission surface 200 are increased in a simplified manner.

As explained above, the shape of the standing wave field is known. In order to minimize the interaction with the radiation field, the tunnel junction is placed in or near an intensity node. The is how absorption in the tunnel junction can be minimized.

Furthermore, the differential efficiency $dP_{opt}/dI$, with the coupled-out radiation power $P_{opt}$ and the injected current I, and/or the differential gain $dg/dn$, with the gain g and the charge carrier density n, are/is advantageously increased.

By means of the Bragg mirrors 7 and 8 of the frequency-selective element 6, additional phase conditions in the resonator are created by reflection in the semiconductor body. The Bragg mirrors are preferably formed in such a way that the intensity is reduced within the frequency-selective element and therefore also in the region of the tunnel junction. In particular, an envelope curve of the intensity distribution of the field of standing waves in the semiconductor body can be shaped by means of the frequency-selective element in such a way that said envelope curve has a local minimum within the frequency-selective element, in particular between the Bragg mirrors of the element. The tunnel junction is preferably arranged in the semiconductor body in such a way that it is arranged in a vicinity of the local minimum generated by means of the frequency-selective element, in particular between two local maxima, of the envelope curve of the intensity distribution 17 in the semiconductor body 2. The tunnel junction is preferably arranged in such a way that the local minimum of the envelope curve lies in the tunnel junction. The manufacturing tolerances in the embodiment of the tunnel junction are thus increased since even in the case of a slight deviation of the arrangement of the tunnel junction from the optimum arrangement in an intensity node, the radiation power that can be absorbed in the tunnel junction is advantageously low on account of the modulated intensity distribution. A reflectivity of the Bragg mirrors 7 and 8 of 30% or more, preferably of 40% or more, for radiation of wavelength λ to be amplified in the resonator is particularly suitable for the intensity modulation. In this case, the frequency selective element (comprising the Bragg mirrors) is used to modify the standing wave field within the resonator (formed by mirrors 11, 12). Between the Bragg mirrors, additional phase conditions (see above) are created. Therefore, the intensity of the radiation field of the particular predetermined mode can be modified. In particular, a local minimum of the radiation field can be formed within the frequency selective element. By doing so, the tunnel junction can be more easily placed in a radiation minimum, thereby reducing absorption.

Preferably, the Bragg mirrors 7 and 8 of the frequency-selective element have a reflectivity of 95% or less or 90% or less, particularly preferably of 80% or less, for the radiation to be amplified in the active regions 4a and 4b. The oscillation build-up of laser submodes in subresonators between the Bragg mirror 7 and the resonator end mirror 11 or the Bragg mirror 8 and the resonator end mirror 12 can thus be prevented.

Accordingly, the resonator is formed in particular as a common resonator for the active regions 4a and 4b, and not as an arrangement of separate resonators one above another. A disadvantageous influence of the Bragg mirrors of the frequency-selective element on the laser properties of the semiconductor component can thus be avoided.

Alternatively or supplementarily, the individual layers of the respective Bragg mirror of the frequency-selective element can also be formed as $\lambda_1/4$ layers for radiation of a wavelength $\lambda_1$, which deviates from the wavelength $\lambda$ of the radiation which is to be amplified by means of the resonator and for which the resonator end mirrors are expediently formed in highly reflective fashion. This deviation can be as much as 10%.

Furthermore, as an alternative or in addition, the frequency-selective element can be formed for instance as an etalon-like element monolithically integrated into the semiconductor body, for longitudinal mode selection. A longitudinally monomode operation of the semiconductor component is thus promoted.

Figure 2B:
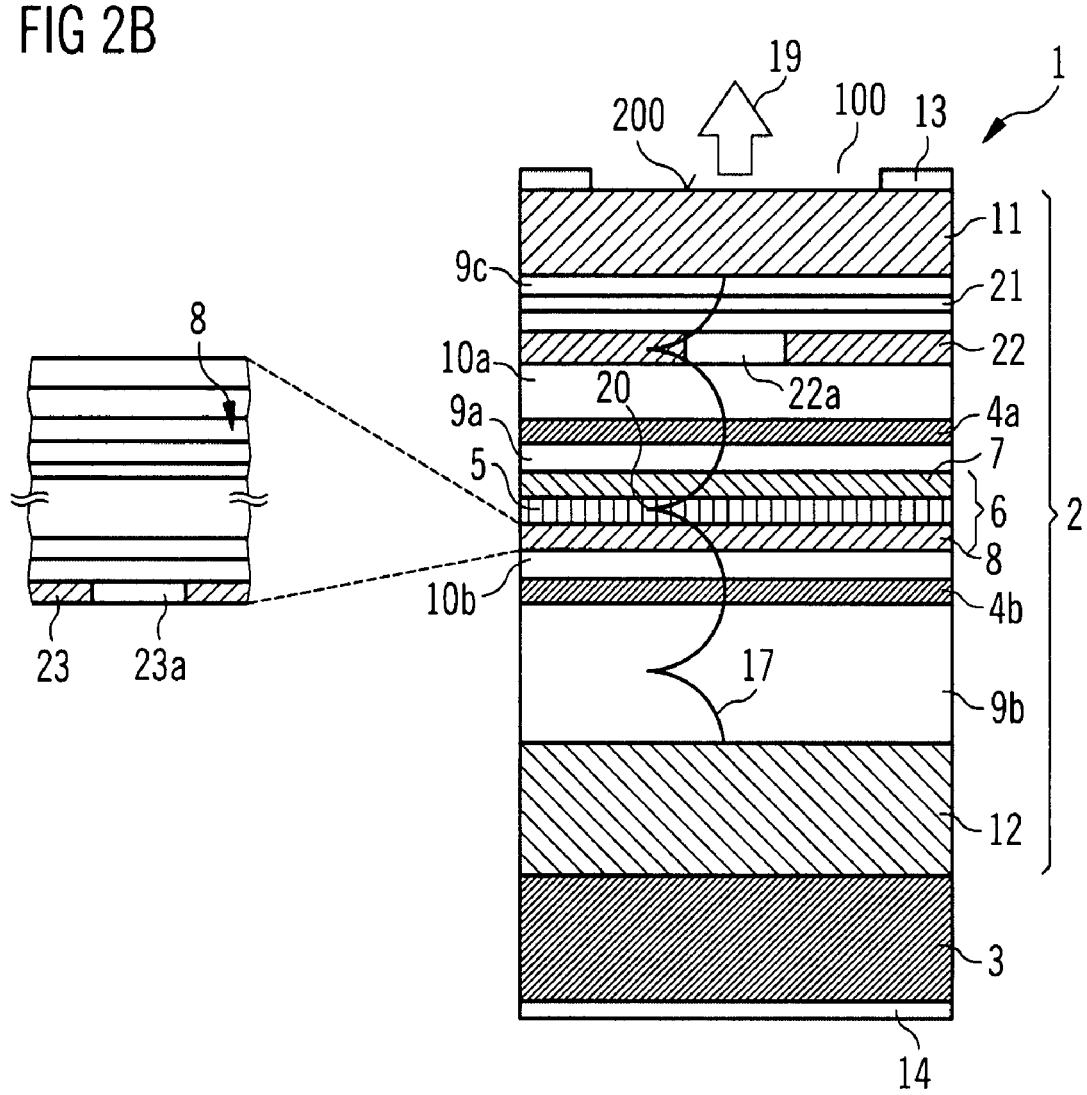
FIG. 2B shows a second exemplary embodiment of a surface emitting semiconductor component.

FIG. 2B shows a schematic sectional view of a second exemplary embodiment of a semiconductor component 1 which can be used in the radiation device SE. The semiconductor component shown in FIG. 2B essentially corresponds to the semiconductor component described in FIG. 2A. In contrast thereto, the semiconductor component has a further tunnel junction 21, a current constriction element 23 and a further current constriction element 22.

The current constriction element 23 is integrated in the, preferably p-conducting, Bragg mirror 8 of the frequency-selective element 6, which is arranged on that side of the tunnel junction which is remote from the emission surface 200, and is arranged between the active regions 4a and 4b. The current constriction element 23 is preferably formed in a layer terminating the Bragg mirror 8 on the side remote from the tunnel junction 5.

The further current constriction element 22 is integrated in a semiconductor layer of the, e.g. p-conducting, semiconductor region 10a arranged between the first contact 13, in particular the emission surface 200, and the closest active region 4a.

The current constriction elements 22 and 23 are preferably embodied as an oxide constriction element in each case. For this purpose, by way of example, an (Al)GaAs layer having a high aluminum content, preferably 80% or greater, is oxidized laterally, with the result that a non-oxidized region (cf. the current-carrying apertures 22a and 23a in the respective current constriction element) having a high conductivity is formed in a central region and an, in particular annular, oxidized region having a low conductivity is formed in the edge region of the semiconductor body 2. The current flow in the semiconductor body can be concentrated on the central region of the semiconductor body by means of the current constriction elements, as a result of which a threshold current density is achieved in a simplified manner and there is also a reduction of the risk of nonradiative recombination in edge regions of the semiconductor body.

By means of two current constriction elements on respectively different sides of an active region, it is possible to efficiently constrict both the current path in the semiconductor body for the supply conduction from the contact 13 to the active region 4a by means of the current constriction element 22a, and the current path between the active regions 4a and 4b. Lateral current spreading between the active regions can be prevented in particular by means of the current constriction element 23. For the simplified formation of apertures of identical size that mutually overlap one another, the layers in which the current constriction elements are respectively formed preferably have the same composition, the same conduction type and/or the same thickness.

Instead of decreasing the electrical conductivity of a semiconductor material for a current constriction element by means of oxidation, a current constriction element may also be formed by decreasing the electrical conductivity by implantation, e.g. proton implantation, in the semiconductor body. In order to laterally limit the current flow in the semiconductor body, the semiconductor body may furthermore also be patterned in a region by means of etching into a reduced lateral dimension suitable for the respective threshold current density (mesa etching). The lateral current limiting can also be supported or obtained by means of a measure of this type. The further current constriction element 22 is preferably arranged around an intensity node 20. Scattering of radiation, which is not amplified in the active regions with increased probability on account of the scattering, at the current constriction element not serving for the generation of radiation can thus be reduced. The current constriction element 23 may, if appropriate, also be arranged around an intensity node (not illustrated).

In contrast to the exemplary embodiment in accordance with FIG. 1, resonator end mirrors 11 and 12 embodied as resonator Bragg mirrors preferably have the same conduction type, in particular n-conducting. The absorption of radiation by free charge carriers in the Bragg mirror can thus be reduced in comparison with a p-conducting Bragg mirror. In order that the electrical linking of the resonator Bragg mirror 11 to the semiconductor region 10a, which preferably has a different conduction type from that of the resonator Bragg mirror, is not impaired by means of a pn junction that is reverse-biased during operation of the component, for instance between the semiconductor regions 9c and 10a, with a high potential barrier, an additional tunnel junction 21 is arranged between the resonator Bragg mirror 11 and the active region 4a closest to the latter. Said additional tunnel junction may be embodied in a manner corresponding to the tunnel junction 5.

As an alternative, the resonator Bragg mirrors 11 and 12 may also have different conduction types. In this case, the further tunnel junction 21 and preferably the semiconductor region 9c may be dispensed with. The current constriction element 22 is then preferably integrated in the, in particular p-conducting, resonator Bragg mirror 11, particularly preferably on that side of the latter which faces the active region 4a. The formation of the current constriction elements in layers of the respective Bragg mirror 11 and 8 which preferably have identical conduction types and/or the same composition is thus facilitated.

Figure 3:
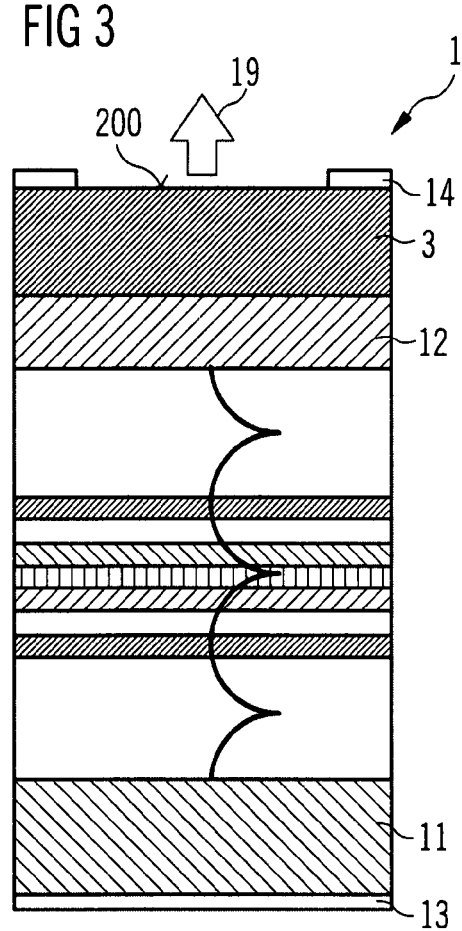
FIG. 3 shows a third exemplary embodiment of a surface emitting semiconductor component.

FIG. 3 shows a schematic sectional view of a further exemplary embodiment of a semiconductor component 1 which can be used in the radiation device SE. The semiconductor component shown in FIG. 3 essentially corresponds to the semiconductor component described in FIG. 2A. In contrast thereto, the semiconductor component is formed as a so-called bottom emitter. The radiation 19 therefore leaves the semiconductor body 2 via that side of the semiconductor body which faces the substrate 3, and passes through the region of the substrate 3. For this purpose, the latter is preferably embodied in radiation-transmissive fashion. In this case, the resonator end mirror 12 facing the substrate 3 expediently serves as a coupling-out mirror. If appropriate, the substrate 3, for the passage of radiation, can also be removed or thinned—completely or in regions. The second contact 14 is preferably embodied as an annular contact for the passage of radiation in a manner corresponding to the first contact 13 in accordance with FIG. 2A. The second resonator end mirror 12, as coupling-out mirror, expediently has a lower reflectivity than the resonator end mirror 11.

Figure 4:
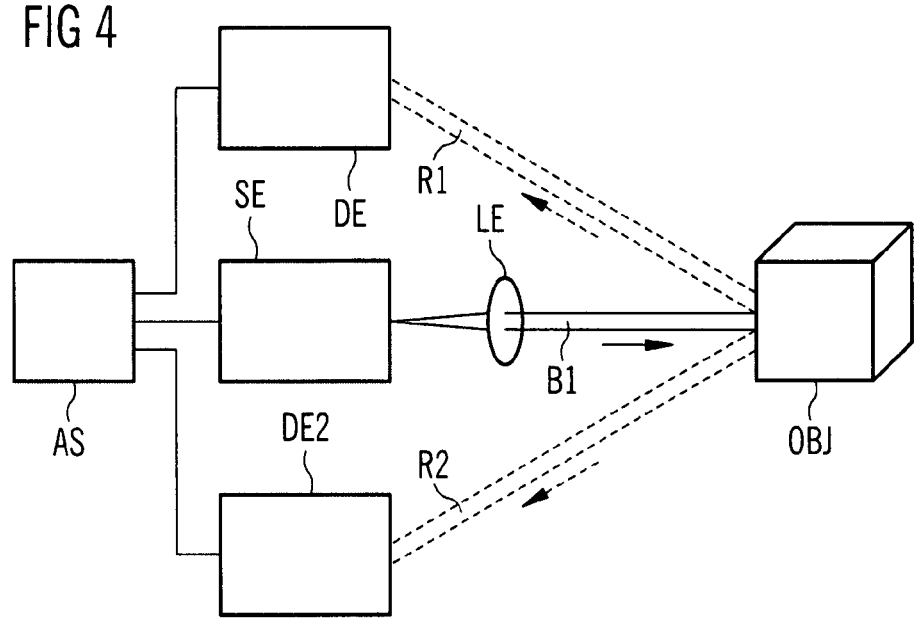
FIG. 4 shows a second exemplary embodiment of a measuring arrangement.

FIG. 4 shows a further exemplary embodiment of a measuring arrangement. In this case, alongside the elements illustrated in FIG. 1, a further detection device DE2 is additionally provided, which is arranged at a spatial distance from the first detection device DE.

By way of example, the radiation B1 emitted by the radiation device SE during operation is reflected from the measurement object OBJ in such a way that a first reflected radiation R1 or a second reflected radiation R2 or a first and a second reflected radiation R1, R2 arise. Consequently, the reflected radiation R1, R2 can be detected by the first detection device DE and/or the second detection device DE2. An evaluation of the detected reflected radiation R1, R2 as a detection result can again be effected in the evaluation circuit AS, as described above for the exemplary embodiment in FIG. 1.

FIG. 5 shows an exemplary embodiment of a transmitting device SE, in which a plurality of surface emitting semiconductor components 1, 1A to 1F are provided, which form a one-dimensional radiation field. In the exemplary embodiment shown in FIG. 5, the semiconductor components are arranged in such a way that the radiation B1 to B7 respectively emitted by the components in each case forms a different angle with respect to the surface of the radiation field. By way of example, each of the semiconductor elements 1, 1A to 1F can be driven individually, such that in each case only one, for example pulsed, beam B1 to B7 is emitted by the radiation device SE. By way of example, with a radiation device SE in accordance with the exemplary embodiment shown, it is possible to measure distances to points of a wider object. It is thus possible to determine for instance the contour of a wider measurement object. One detection device may be sufficient for a detection of respectively reflected radiation. As an alternative, a plurality of detection devices can be provided.

FIG. 6 shows a further exemplary embodiment of a radiation field, in which a plurality of surface emitting semiconductor elements form a two-dimensional radiation field. In the radiation device shown, for example five times three semiconductor components 1AA, 1AB, 1AC, 1BA, 1BB, 1BC, 1CA, 1CB, 1CC, 1DA, 1DB, 1DC, 1EA, 1EB, 1EC are provided for this purpose, said semiconductor components being arranged in rectangular fashion in a matrix. The radiation-emitting semiconductor components 1AA to 1EC have a common radiation area 200 via which radiation, preferably laser radiation, can be emitted in each case. In a manner similar to that in the case of the one-dimensional radiation field from FIG. 5, the semiconductor components of the two-dimensional radiation field can each have different radiation angles with respect to the radiation area 200 and can be driven individually. Consequently, it is possible to determine for example distances to points on a surface of a measurement object in order to derive a surface structure of the object therefrom.

FIG. 7 shows a further exemplary embodiment of a radiation device SE. In this case, the radiation device SE comprises a first and a second radiation-emitting semiconductor component 1A, 1B, which are designed for emitting a respective individual beam B1A, B1B. Furthermore, a lens LE is provided, which is provided for collimating, that is to say concentrating, the two partial beams B1A, B1B to form a common beam B1. Consequently, the beam B1 has a higher radiation density than a respective individual beam B1A, B1B. In further embodiments, individual beams of a plurality of semiconductor components can also be concentrated to form a common beam B1.

The radiations B1 emitted by the radiation device SE or by the semiconductor components 1 can also be shaped or guided by other optical elements.

Figure 8:
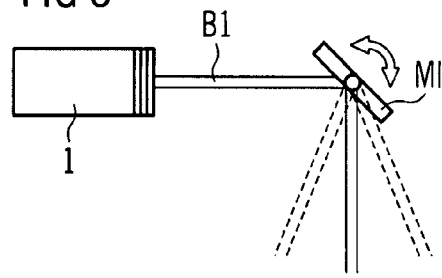
FIG. 8 shows an exemplary embodiment of a surface emitting semiconductor component with a mirror.

FIG. 8 shows an exemplary embodiment of a radiation-emitting semiconductor element 1 with a mirror M1, which is mounted in movable fashion. The radiation B1 of the semiconductor element 1 impinges on the mirror M1 and is diverted or reflected depending on the position or the angle of the mirror in one of many possible angles. In a manner similar to that in the case of the one-dimensional radiation field, radiation pulses can therefore be directed onto different positions or points of a measurement object in order to determine for example a contour of the measurement object.

Figure 9:
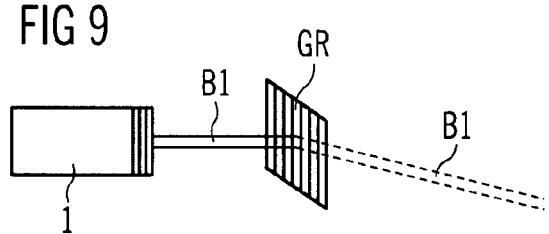
FIG. 9 shows an exemplary embodiment of a surface emitting semiconductor component with a grating.

FIG. 9 shows a further exemplary embodiment of a semiconductor element 1 with an optical element, which is embodied as an optical grating GR in this exemplary embodiment. In this case, the beam B1 emitted by the semiconductor element 1 is diffracted at the grating GR, such that the beam B1 is deflected from the original radiation direction. In the case of optical influencing of a beam by an optical grating, mention may also be made of diffractive influencing. In an alternative exemplary embodiment, the optical grating GR can also be replaced by an optical slit which likewise effects a diffractive deflection of the beam B1.

Figure 10:
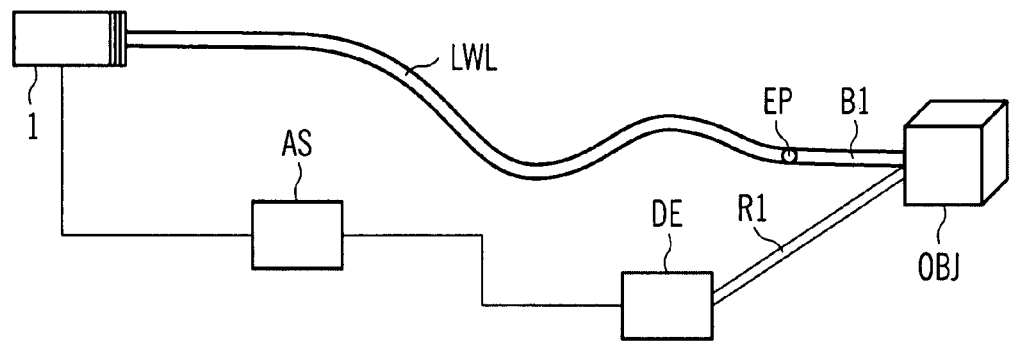
FIG. 10 shows a third exemplary embodiment of a measuring arrangement.

FIG. 10 shows a further exemplary embodiment of a measuring arrangement comprising an evaluation circuit AS, a semiconductor component 1 and a detection device DE. An optical fiber LWL is furthermore provided, into which the radiation emitted by the semiconductor component 1 can be coupled in order to transport it via the optical fiber LWL to an actual emission point EP. In a manner similar to that in the case of the exemplary embodiment in FIG. 1, a beam B1 can be emitted, which impinges on a measurement object OBJ and is reflected back from the latter as reflected beam R1. The reflected radiation R1 can in turn be detected by the detection device DE and processed in the evaluation circuit AS.

Figure 11:
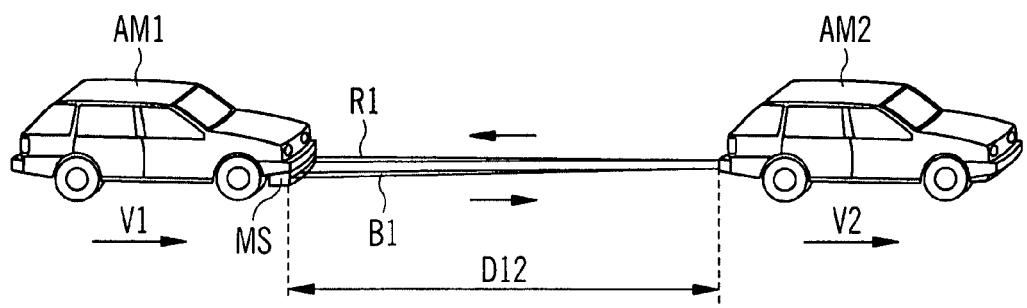
FIG. 11 shows an exemplary embodiment of an adaptive cruise control.

FIG. 11 shows an exemplary embodiment of a measuring system MS comprising a measuring arrangement according to one of the exemplary embodiments described, the measuring system MS being formed as an adaptive cruise control. For this purpose, FIG. 11 illustrates a first and a second vehicle AM1, AM2 moving at a first speed V1 and a second speed V2, respectively. The first vehicle AM1 has the measuring system MS discussed, which emits radiation during operation, for example in the form of a laser beam B1, which is reflected back from the second vehicle AM2 as reflected radiation R1. As described above, the reflected radiation R1 can be detected by the detection device in the measuring arrangement of the measuring system MS. Consequently, by way of example, by means of the propagation time of the radiation B1 and R1, respectively, it is possible to determine a distance D12 between the first and the second vehicle AM1, AM2 and also a relative speed of the second vehicle AM2 with respect to the first vehicle AM1. In this case, a relative speed determined in this way corresponds to a value of a speed difference between the second and first speed V2–V1.

If the speed V1 of the first vehicle AM1 is known to the measuring system, for example, the absolute speed V2 of the second vehicle AM2 can therefore also be determined. With the (relative) speed determined, it is possible for example to perform an adaptation of the speed V1 of the first vehicle AM1 in order for example to maintain or achieve a predetermined distance between the vehicles AM1, AM2.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

In particular, the invention should not be regarded as restricted to a measuring arrangement or a measuring system comprising a radiation-emitting semiconductor component having only two active regions. Rather, a larger number of active regions, preferably in a common resonator, can also be provided. Said active regions are preferably electrically conductively connected in series in each case in pairs by means of a tunnel junction arranged between each two active regions, if appropriate in each case with a frequency-selective element surrounding the tunnel junction. By way of example, up to ten active regions can be provided. In this way, the efficiency of the semiconductor component can be increased more extensively, if appropriate.

Furthermore, a one- or two-dimensional, linear or areal, preferably matrix-like, arrangement of semiconductor components in the radiation device can also be regarded as encompassed by the invention. This arrangement is preferably embodied in monolithically integrated fashion, that is to say by means of epitaxial growth of a semiconductor layer sequence for the semiconductor bodies of the different semiconductor components and preferably embodiment of the components on an individual growth substrate. Thereby a multiplicity of semiconductor components can be concentrated in a small space separated by a small distance.

I claim:

1. A measuring arrangement, comprising:
   a radiation device, having at least one first surface emitting semiconductor component with a vertical emission direction which comprises a semiconductor body with a plurality of active regions suitable for generating radiation and arranged at a distance from one another in a vertical direction, in which a tunnel junction is monolithically integrated in the semiconductor body between two active regions and the two active regions are electrically conductively connected by means of the tunnel junction during operation of the first surface emitting semiconductor component, wherein a frequency-selective element is formed between said two active regions, said tunnel junction being surrounded by or embedded into the frequency-selective element;
   a detection device for detecting reflected radiation; and
   an evaluation circuit, set up for controlling the radiation device and the detection device and for processing a detection result of the detection device.

2. The measuring arrangement as claimed in claim 1, in which the frequency-selective element is formed in such a way that the intensity of the generated radiation in the semiconductor body is reduced within the frequency-selective element.

3. The measuring arrangement as claimed in claim 1, in which the frequency-selective element has a first and a second Bragg mirror.

4. The measuring arrangement as claimed in claim 3, in which the first and/or the second Bragg mirror has a reflectivity of 95% or less.

5. The measuring arrangement as claimed in claim 3, in which the two Bragg mirrors have different conduction types.

6. The measuring arrangement as claimed in claim 3, in which the tunnel junction is arranged between the two Bragg mirrors of the frequency-selective element.

7. The measuring arrangement as claimed in claim 1, in which the frequency-selective element is monolithically integrated in the semiconductor body.

8. The measuring arrangement as claimed in claim 1, in which a current constriction element is formed between two of the active regions.

9. The measuring arrangement as claimed in claim 1, in which the first surface emitting semiconductor component has an internal resonator or is designed for operation with an external resonator.

10. The measuring arrangement as claimed in claim 9, in which, in the semiconductor body, two active regions are arranged as amplifying regions within the resonator and the resonator is formed as a common resonator for both active regions.

11. The measuring arrangement as claimed in claim 9, in which the semiconductor body is formed in such a way that a radiation field that forms within the resonator during operation of the first surface emitting semiconductor component has an intensity minimum within the tunnel junction.

12. The measuring arrangement as claimed in claim 9, in which the resonator is formed by means of a first resonator mirror and a second resonator mirror.

13. The measuring arrangement as claimed in claim 12, in which the first resonator mirror and/or the second resonator mirror are/is embodied as Bragg mirror(s).

14. The measuring arrangement as claimed in claim 12, in which at least one resonator mirror is doped.

15. The measuring arrangement as claimed in one claim 12, in which the resonator mirrors have one of the following configurations: identical conduction type, different conduction type.

16. The measuring arrangement as claimed in claim 12, in which both resonator mirrors are embodied in n-conducting fashion.

17. The measuring arrangement as claimed in claim 1, in which the first surface emitting semiconductor component is embodied for operation as an electrically pumped semiconductor laser component.

18. The measuring arrangement as claimed in claim 1, in which the first surface emitting semiconductor component is formed as a VCSEL.

19. The measuring arrangement as claimed in claim 1, in which two of the active regions comprise a quantum well structure.

20. The measuring arrangement as claimed in claim 1, in which the tunnel junction has two tunnel semiconductor layers of different conduction types.

21. The measuring arrangement as claimed in claim 1, in which the semiconductor body contains a III-V semiconductor material, in particular a material from the III-V semiconductor material systems $In_xGa_yAl_{1-x-y}P$, $In_xGa_yAl_{1-x-y}N$ or $In_xGa_yAl_{1-x-y}As$, in each case where and $0 \leq x \leq 1$, $0 \leq y \leq 1$ and $x+y \leq 1$.

22. The measuring arrangement as claimed in claim 1, in which the semiconductor body (2) contains a III-V semiconductor material, in particular a material from the III-V semiconductor material systems InGaAsN, InGaAsSb, InGaAsSbN or $In_xGa_{1-x}As_yP_{1-y}$ where $0 \leq x \leq 1$ and $0 \leq y \leq 1$.

23. The measuring arrangement as claimed in claim 1, in which at least two of the active regions are embodied for radiation of different wavelengths.

24. The measuring arrangement as claimed in claim 1, in which the detection device (DE) has at least one first photosemiconductor element.

25. The measuring arrangement as claimed in claim 24, in which the at least one first photosemiconductor element is embodied as a photodiode or as a phototransistor or as a photoresistor.

26. The measuring arrangement as claimed in claim 1, in which a second detection device for detecting reflected radiation is provided, which is coupled to the evaluation circuit for control and processing.

27. The measuring arrangement as claimed in claim 1, in which the radiation device has a plurality of surface emitting semiconductor components corresponding to the first surface emitting semiconductor component.

28. The measuring arrangement as claimed in claim 27, in which the plurality of surface emitting semiconductor components are arranged as a one-dimensional or two-dimensional radiation field.

29. The measuring arrangement as claimed in claim 27, in which a radiation emission of the plurality of surface emitting semiconductor components is individually controllable.

30. The measuring arrangement as claimed in claim 27, in which a radiation emission of the plurality of surface emitting semiconductor components can be effected in concentrated fashion.

31. The measuring arrangement as claimed in claim 1, in which the measuring arrangement comprises at least one optical element for beam shaping and/or for beam guiding of the radiation emitted by the radiation device.

32. The measuring arrangement as claimed in claim 31, in which the at least one optical element has at least one of the following elements:
a mirror;
an optical slit;
an optical grating;
a lens;
an optical fiber.

33. The measuring arrangement as claimed in claim 1, in which the evaluation circuit is set up to control a radiation emission of the first surface emitting semiconductor component in pulsed fashion.

34. A measuring system comprising a measuring arrangement as claimed in claim 1, the measuring system being set up for distance measurement.

35. A measuring system comprising a measuring arrangement as claimed in claim 1, the measuring system being set up for speed measurement.

36. A measuring system comprising a measuring arrangement as claimed in claim 1, the measuring system being formed as an adaptive cruise control.

37. The measuring arrangement as claimed in claim 3, in which the first and/or the second Bragg mirror has a reflectivity of 90% or less.

38. The measuring arrangement as claimed in claim 3, in which the first and/or the second Bragg mirror has a reflectivity of 80% or less.

* * * * *